United States Patent [19]
Wu et al.

[11] Patent Number: 5,974,066
[45] Date of Patent: Oct. 26, 1999

[54] LOW COST, EFFICIENT VERTICAL CAVITY SURFACE EMITTING LASER PACKAGE, METHOD, BAR CODE SCANNER AND OPTICAL STORAGE UNIT

[75] Inventors: Sean Wu, Palatine; Chao-pin Yeh, Schaumburg; Karl Wyatt, Cary; Jang-Hun (James) Yeh; James Morikuni, both of Schaumburg, all of Ill.

[73] Assignee: Motorola, Inc., Schaumburg, Ill.

[21] Appl. No.: 08/853,606

[22] Filed: May 9, 1997

[51] Int. Cl.⁶ ............................................. H01S 3/18
[52] U.S. Cl. ....................... 372/43; 372/36; 372/33; 438/126; 438/25
[58] Field of Search ....................... 372/29, 31, 33, 372/36, 43; 438/125, 126, 25

[56] References Cited

FOREIGN PATENT DOCUMENTS

| | | | |
|---|---|---|---|
| 450-560 | 10/1991 | European Pat. Off. | 372/43 |
| 58-170091 | 10/1983 | Japan | 372/43 |
| 60-257584 | 12/1985 | Japan | 372/33 |
| 62-296593 | 12/1987 | Japan | 372/43 |
| 3-8385 | 1/1991 | Japan | 372/43 |
| 5-299779 | 11/1993 | Japan . | |
| 6-209138 | 7/1994 | Japan | 372/43 |

*Primary Examiner*—Rodney Bovernick
*Assistant Examiner*—Quyen Phan Leung
*Attorney, Agent, or Firm*—Darleen J. Stockley

[57] ABSTRACT

The present invention provides a low cost, efficient vertical cavity surface emitting laser package (300) and manufacturing method, the package having a head assembly having at least three leads, a vertical cavity surface emitting laser die bonded to a top surface of the head assembly, for generating a beam of light, and a photodiode, die bonded to the top surface of the head assembly proximate to the vertical cavity surface emitting laser for receiving at least a portion of the beam of light, and generating feedback for adjusting an electrical input current to the vertical cavity surface emitting laser based on a received optical power of the portion of the beam of light received. The vertical cavity surface emitting laser and the photodiode are injection molded in a predetermined shape with a recessed area for placement of a partially reflective holographic optical element/reflector.

6 Claims, 4 Drawing Sheets

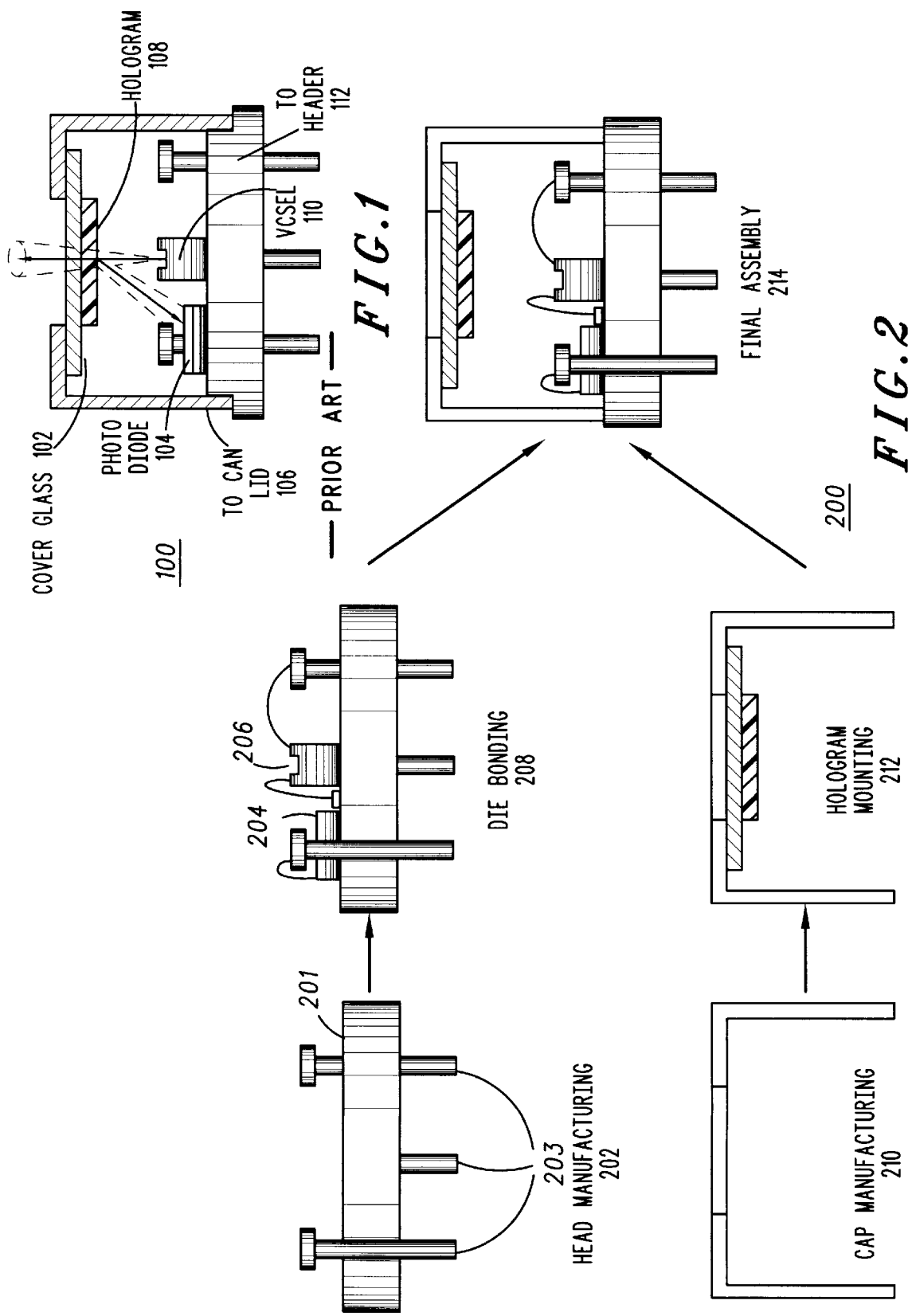

LOW COST, EFFICIENT VERTICAL CAVITY SURFACE EMITTING LASER PACKAGE, METHOD, BAR CODE SCANNER AND OPTICAL STORAGE UNIT

RELATED APPLICATION

The present application is related to U.S. patent application Ser. No. 08/682,973, Device, Method, Bar Code Scanner and Optical Storage Unit for Proving Optical Feedback for an Optical Emitter Using Holograms, by Jang-Hun (James Yeh), Austin V. Harton, Wenbin Jiang, Michael Lebby, Daniel M. Lucey, James J. Morikuni and Karl W. Wyatt, filed Jul. 16, 1996 and assigned to Motorola, Inc.

FIELD OF THE INVENTION

The present invention relates to providing optical feedback for applications requiring optical emitters and, more particularly, to using low cost packaging for devices using holograms as a feedback mechanism.

BACKGROUND OF THE INVENTION

The present invention relates, in general to a vertical cavity surface emitting laser (VCSEL).

A VCSEL is a semiconductor laser diode in which the laser oscillation and the optical emission occur in a direction normal to the pn junction plane. This device has many properties which are advantageous when compared to the more commonly used edge-emitting laser diodes. These properties include: low optical beam divergence, a circular optical output, and single longitudinal mode operation. In addition, VCSEL devices are manufactured in a manner which allows wafer level testing of individual devices. These properties make VCSELs attractive in applications such as optical data storage, data communication and laser scanners.

In most systems utilizing semiconductor lasers, dynamic stabilization and control of the optical output power is required. In edge emitting laser diodes this is usually accomplished by allowing a portion of the light emitted by the laser diode, i.e., using light emitted from the laser diode's rear mirror for bias control, to illuminate an optical photodetector which produces a photocurrent proportional to the intensity of the light emitted by the laser diode. This optically generated photocurrent, in turn drives a feedback circuit which controls the laser bias current. However, due to the structure of the VCSEL, light emitted from the rear mirror is absorbed by the GaAs substrate. Thus, the system of using light emitted from the rear mirror is unavailable for bias control.

Monolithic integration of the photodetector to detect laser light from either the top or bottom mirrors has been attempted, "Monolithic Integration of Photodetector With Vertical Cavity Surface Emitting Laser", G. Hasnain et al., Electronic Letters, Vol. 27, No. 18, Aug. 29, 1991, pp. 1630–1632. This implementation, while attractive, is complex and may be very costly to manufacture. Integration of a lateral detector has also been proposed, "Feedback Mechanism for Vertical Cavity Surface Emitting Lasers", End Tabatataie, U.S. Pat. No. 5,285,466. This technique has the limitation of only detecting the emission of spontaneous light from the laser. This results in a photocurrent which is not proportional to the total optical power of the VCSEL.

An optical package has been devised for efficiently providing automatic optical feedback for an optical emitter. However, the present optical packages include a metal header and can (TO-46 or 56 cans) as shown in FIG. 1, numeral 100. FIG. 2, numeral 200, illustrates steps for the manufacturing process for a metal can VCSEL package s is known in the art. Typically the header (201) is manufactured (202) with, for example, three leads (203). The present optical packages are typically assembled by die bonding (208) a VCSEL (110; 206) and a photodetector (Photo Diode, 104; 204) onto the header (201). In a final assembly, the metal can/cap, with a hologram (108) adhered to a glass window (Cover Glass, 102), is thermally welded (214) to the header (112).

However, this process has a relatively high cost due to the stringent tolerance/alignment requirements needed for the hologram to reflect a laser beam precisely onto the photodetector (104). The hologram (108) must be attached to a glass window (102). A metal can/cap is manufactured (210), and the glass-hologram assembly must then be attached (212) to the lid of the metal can (TO Can Lid, 106). The metal generally gives rise to parasitic inductor-capacitor coupling to the wirebond (i.e., to the VCSEL and photodetector pads) and/or the header, thus limiting the high speed operation of the VCSEL package to less than 1.5 Gigabits/sec.

Since the issues of cost and speed of operation are critical to the performance and manufacture of the VCSEL package, there is a need for a low cost fabrication device, method, bar code scanner and optical storage unit for providing optical feedback for an optical emitter using holograms wherein the interference due to parasitic inductor-capacitor coupling is minimized.

BRIEF DESCRIPTION OF THE DRAWINGS

FIG. 1 is a schematic representation of a VCSEL package as is known in the art.

FIG. 2 is a schematic representation of steps for the manufacturing process for a metal can VCSEL package as is known in the art.

DETAILED DESCRIPTION OF A PREFERRED EMBODIMENT

The present invention utilizes a low cost, non-parasitic material that is injection-molded to the desired shape, substantially encasing the VCSEL and the photodetector, which have been wirebonded to a header to provide a VCSEL package. The molded shape also provides for placement of a partially reflective holographic optical element/reflector or hologram, typically providing a recessed area for affixing the hologram with adhesive. The injection molding material is transparent, permitting the laser beam to travel from the VCSEL to the hologram. The resulting injection-molded unit may, for example, be utilized in a bar code scanner, optical link or an optical storage unit. Thus, the present invention may be utilized to provide a low cost fabrication device, method, bar code scanner, optical link and/or optical storage unit for providing optical feedback for an optical emitter using holograms wherein the interference due to parasitic inductor-capacitor coupling is minimized.

Figure 3:
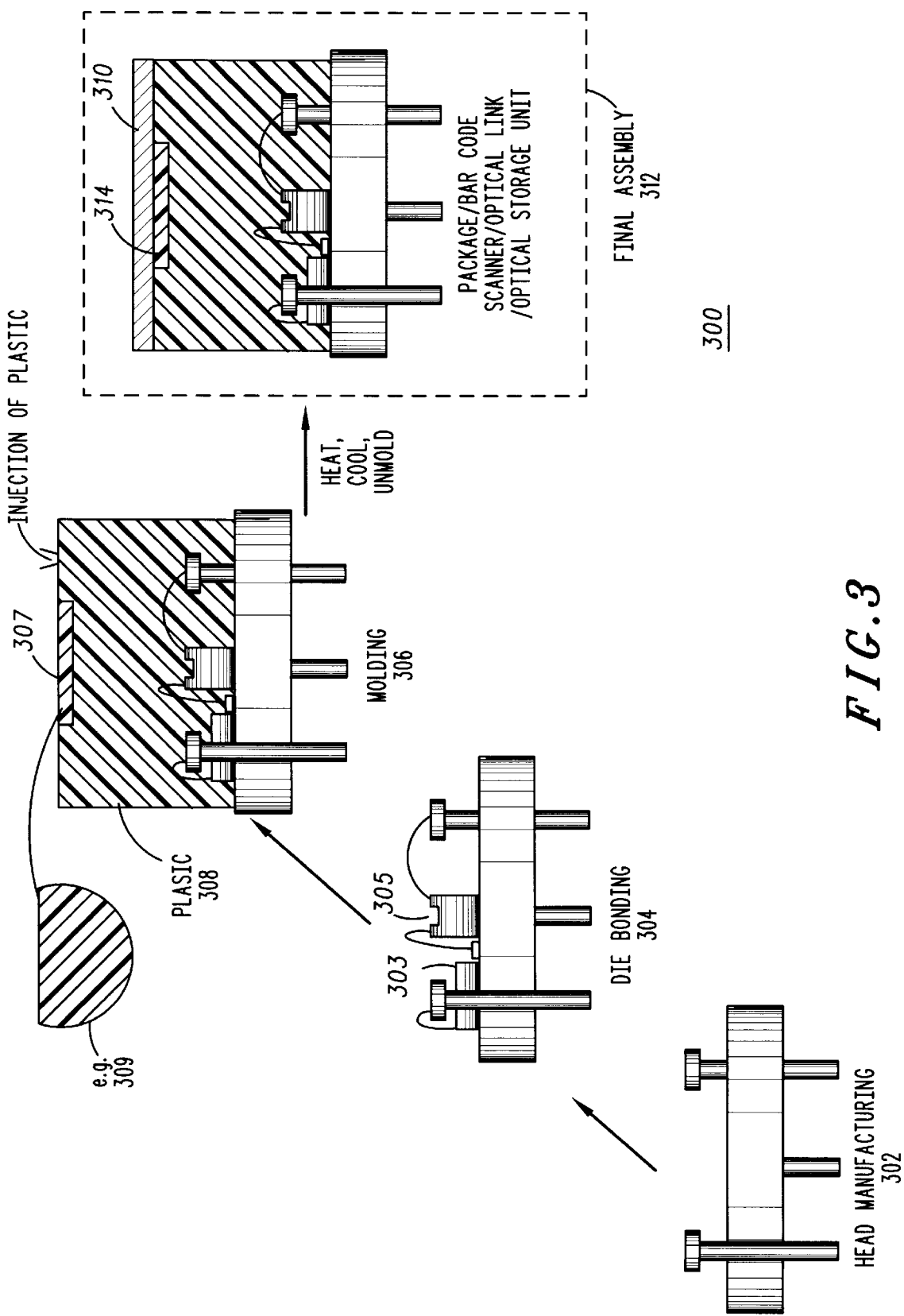
FIG. 3 is a schematic representation of steps for the manufacturing process for a VCSEL package in accordance with the present invention.

FIG. 3, numeral 300, is a schematic representation of steps for the manufacturing process for a VCSEL package in accordance with the present invention. The head/header is manufactured (302) as is known in the art. The VCSEL and the photodiode are die bonded (304), also as is known in the art. Then a mold is placed on the head/header and a preselected injection molding material, e.g., a transparent plastic (308), is injected into the mold (306). The transparent plastic is selected so that its optical properties (refractive index, etc.) mechanical CTE (coefficient of thermal expansion), adhesion strength, Young's modulus, and other desired properties meet the predetermined design and performance characteristics needed for the selected VCSEL package application. The assembly is heated to a predetermined temperature for thermal reaction. Typically, for a transparent plastic such as PMMA, polymethyl methacrylate, the assembly is heated to between 40° C. to 60° C. while the injected liquid plastic is at approximately 200° C. The assembly is then cooled, and the mold is removed. The mold typically has a depressed area (307), at least partially above the VCSEL unit, for placement of a hologram (314). In a preferred embodiment, the depression is shaped (309) to facilitate accurate placement of the hologram. For example, a shape that is circular except that a chord slices off a portion of the circle allows for placement of a hologram of the same shape. In addition, where selected, a cover or overcoating (310) may be applied to seal and protect the hologram. Note that, where needed, the overcoating may be used for protection.

The electrical connections are as described in present U.S. patent application Ser. No. 08/682,973, Device, Method, Bar Code Scanner and Optical Storage Unit for Proving Optical Feedback for an Optical Emitter Using Holograms, by Jang-Hun (James Yeh), Austin V. Harton, Wenbin Jiang, Michael Lebby, Daniel M. Lucey, James J. Morikuni and Karl W. Wyatt, filed Jul. 16, 1996 and assigned to Motorola, Inc., which said patent application is incorporated herein by reference.

Figure 4:
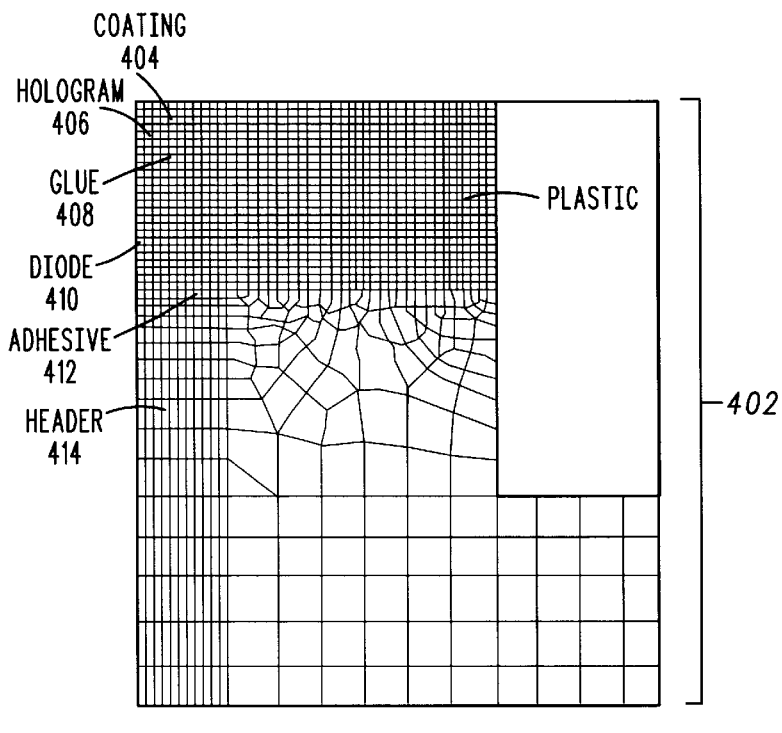
FIG. 4 is a schematic representation of a geographic model of a VCSEL package in accordance with the present invention, wherein the VCSEL package has been subjected to temperature stress.

FIG. 4, numeral 400, is a schematic representation of a geographic model of a VCSEL package in accordance with the present invention, wherein the VCSEL package has been subjected to temperature stress over a range of 75 to −10° C. Geometric modeling (402) shows temperature effects on the coating (404), the hologram (406), the glue (408), the photodiode (diode, 410), the adhesive (412) and the header (414). Note that the greatest stress is exhibited in the header (414) for the temperature range of 75 to −10° C.

Figure 5:
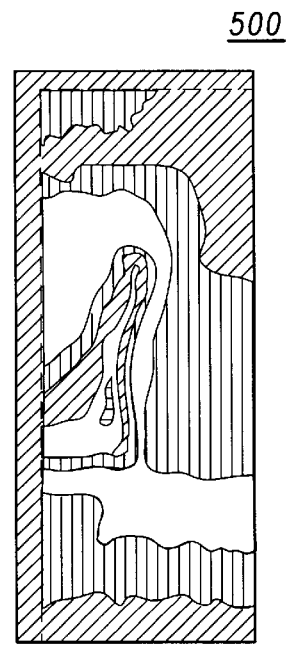
FIG. 5 is a schematic representation of a geographic model of a VCSEL package in accordance with the present invention, wherein the VCSEL package has been subjected to pressure stress.

FIG. 5, numeral 500, is a schematic representation of a geographic model of a VCSEL package in accordance with the present invention, wherein the VCSEL package has been subjected to pressure stress up to 65 MPa. The VCSEL package is arranged in the same orientation as that shown in FIG. 4. The stress distribution (502) shows greatest stress in the header area.

Figure 6:
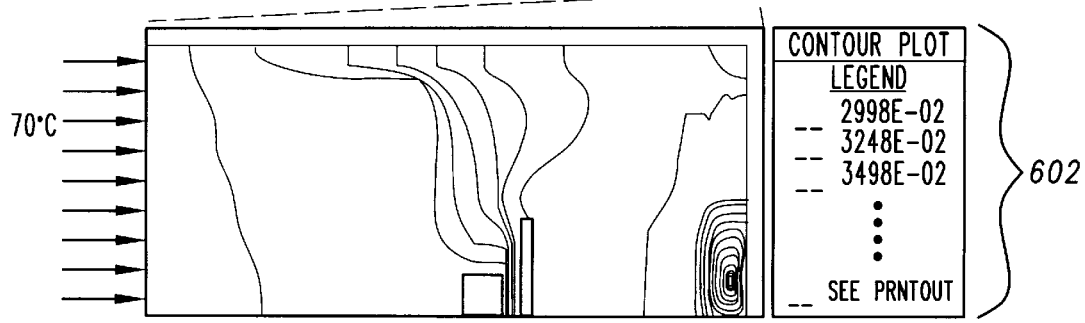
FIG. 6 is a representation of a temperature contour plot of a metal cap VCSEL package.
Figure 7:
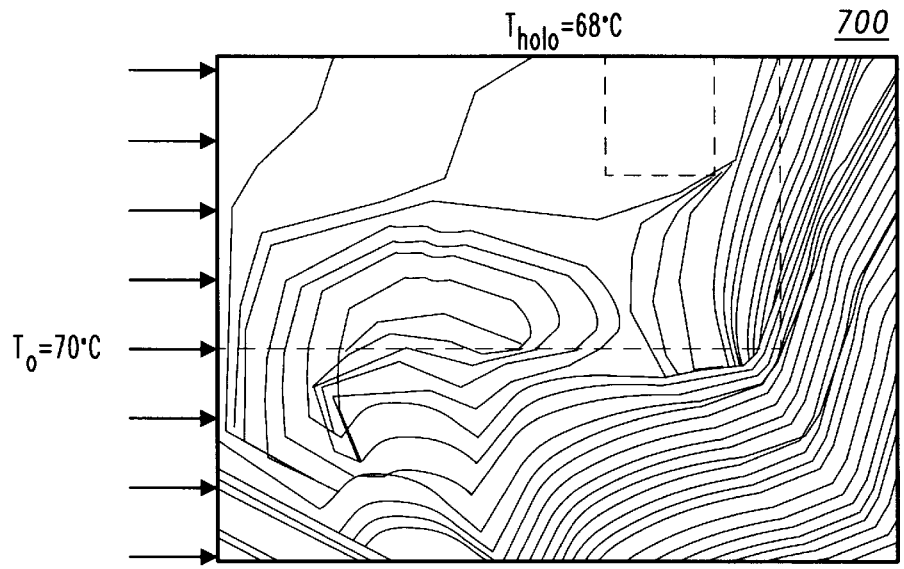
FIG. 7 is a representation of a temperature contour plot of a VCSEL package in accordance with the present invention.

FIG. 6, numeral 600, is a representation of a temperature contour plot (602) of a metal cap VCSEL package, wherein the VCSEL package has been subjected to a temperature of 70° C., and the temperature of the hologram, $T_{holo}$, is 67.5° C. FIG. 7, numeral 700, is a representation of a temperature contour plot (700) of a VCSEL package in accordance with the present invention, wherein the VCSEL package has been subjected to a temperature $T_o$ of 70° C., and the temperature of the hologram, $T_{holo}$, is 68° C. If the temperature is 25° C., the temperature of the hologram, $T_{holo}$, is 25.85° C. and the temperature of the diode is 25.9° C. The present invention shows thermal behavior very similar to the thermal behavior of the metal cap VCSEL package of the prior art, and is thus believed to be as thermally stable as the metal cap VCSEL package of the prior art.

As described in U.S. patent application Ser. No. 08/682,973, Device, Method, Bar Code Scanner and Optical Storage Unit for Proving Optical Feedback for an Optical Emitter Using Holograms, by Jang-Hun (James Yeh), Austin V. Harton, Wenbin Jiang, Michael Lebby, Daniel M. Lucey, James J. Morikuni and Karl W. Wyatt, the present invention uses a hologram to direct a predetermined portion of the light emitted from the top surface of the VCSEL onto a separate adjacent photodetector. Thus, the resulting photocurrent is proportional to the total optical power of the VCSEL. In addition, the hologram can be designed to reflect a predetermined percentage of the total optical output power. The hologram can also be used to reduce the area of illumination on the optical sensing element. This may result in a reduction in the size of the required photodetector.

The low cost, efficient vertical cavity surface emitting laser package (final assembly, 312) of the present invention includes: A) a head assembly (302) having at least three leads; B) a vertical cavity surface emitting laser (305) die bonded to a top surface of the head assembly, for, responsive to an electrical input current, generating a beam of light; and C) a photodiode (303), die bonded to the top surface of the head assembly proximate to the vertical cavity surface emitting laser (305), arranged to receive at least a portion of the beam of light, for generating feedback for adjusting an electrical input current to the vertical cavity surface emitting laser (305) based on a received optical power of the portion of the beam of light received, wherein the vertical cavity surface emitting laser (305) and the photodiode (303) are injection molded in a predetermined shape with a recessed area for placement of a partially reflective holographic optical element/reflector.

The partially reflective holographic optical element/reflector may be selected to be one of: a partially reflective volume holographic optical element recorded in a holographic film, a diffractive optical element other than a partially reflective volume holographic optical element, or a partially reflecting surface tilted at a predetermined angle.

Figure 8:
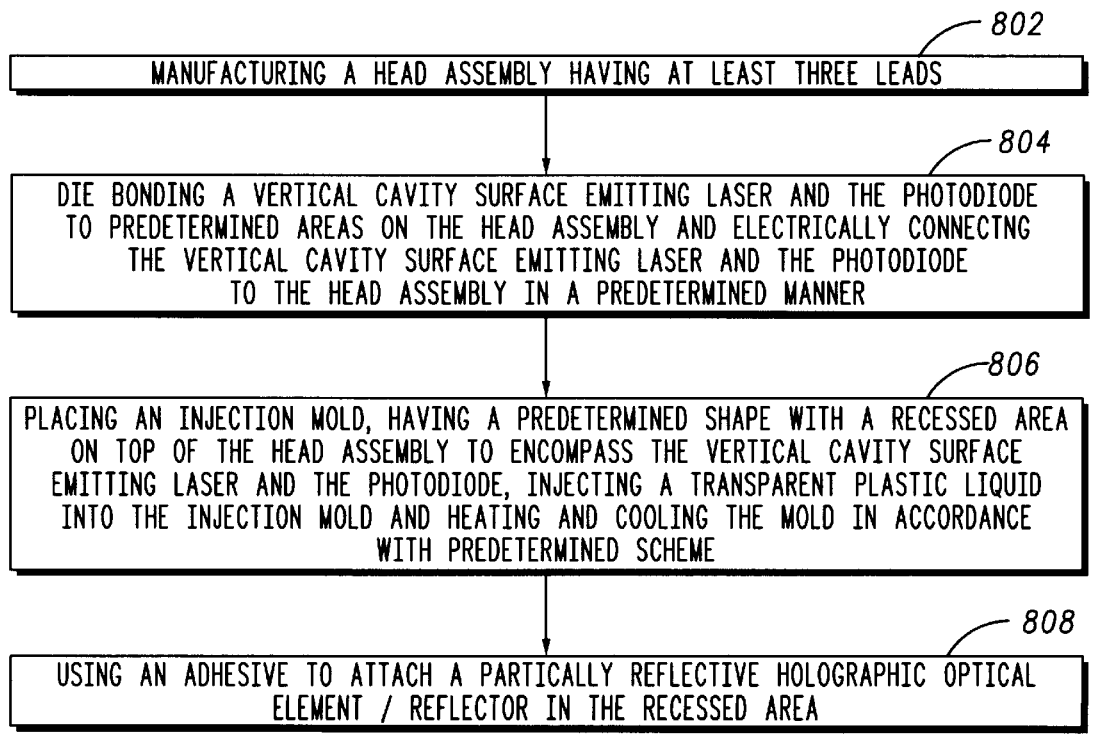
FIG. 8 is a flow chart showing one embodiment of steps for a method for manufacturing a low cost, efficient frequency response vertical cavity surface emitting laser package in accordance with the present invention.

As shown in FIG. 8, numeral 800, the present invention provides a method for manufacturing a low cost, efficient frequency response vertical cavity surface emitting laser package. The steps include: A) manufacturing (802) a head assembly having at least three leads; B) die bonding (804) a vertical cavity surface emitting laser and the photodiode to predetermined areas on the head assembly and electrically connecting the vertical cavity surface emitting laser and the photodiode to the head assembly in a predetermined manner; C) placing an injection mold, having a predetermined shape with a recessed area, on top of the head assembly to encompass the vertical cavity surface emitting laser and the photodiode, injecting a transparent plastic liquid into the injection mold and heating and cooling the mold in accordance with a predetermined scheme (806); and D) using an adhesive to attach a partially reflective holographic optical element/reflector in the recessed area (808). Injection molding and applying adhesive to a holographic optical element/reflector are known in the art. The partially reflective holographic optical element/reflector may be selected as set forth above.

A bar code scanner, an optical communication link, or an optical storage unit may utilize the low cost, efficient vertical cavity surface emitting laser package in accordance with the present invention. An optical storage unit that may utilize the present invention may be one of: a compact disk player; a digital video disk player; a compact disk read-only memory drive; a magneto-optical disk drive; or a laser disk player.

The present invention provides advantages that include a lower material cost (plastic instead of metal), a lower manufacturing cost (self alignment feature allows easily controlled placement of the hologram) and allows use of a greater frequency range response since capacitance and inductance of the plastic is much smaller than the capacitance and inductance of the metal can.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A low cost, efficient vertical cavity surface emitting laser package, comprising:
    A) a head assembly;
    B) a vertical cavity surface emitting laser die bonded to a top surface of the head assembly, responsive to an electrical input current, generating a beam of light;
    C) a partially reflective volume holographic optical element recorded in a holographic film;
    D) a photodiode, die bonded to the top surface of the head assembly proximate to the vertical cavity surface emitting laser, arranged to receive at least a portion of the beam of light, for generating feedback for adjusting an electrical input current to the vertical cavity surface emitting laser based on a received optical power of the portion of the light received, wherein the vertical cavity surface emitting laser and the photodiode are injection molded in a predetermined shape, and wherein a recessed area for placement of the partially reflective volume holographic optical element recorded in a holographic film is provided in the injection molding providing for a predetermined alignment of the vertical cavity surface emitting laser and the photodiode with the partially reflective volume holographic optical element recorded in a holographic film.

2. A method for manufacturing a low cost, efficient frequency response vertical cavity surface emitting laser package, comprising the steps of:
    A) manufacturing a head assembly;
    B) die bonding a vertical cavity surface emitting laser and a photodiode to predetermined areas on the head assembly and electrically connecting the vertical cavity surface emitting laser and the photodiode to the head assembly in a predetermined manner;
    C) placing an injection mold, having a predetermined shape with a recessed area, on top of the head assembly to encompass the vertical cavity surface emitting laser and the photodiode, injecting a transparent plastic liquid into the injection mold and heating and cooling the mold in accordance with a predetermined scheme; and
    D) providing a partially reflective volume holographic optical element recorded in a holographic film in the recessed area, wherein the partially reflective volume holographic optical element recorded in a holographic film provided in the injection molding provides for a predetermined alignment of the vertical cavity surface emitting laser and the photodiode with the partially reflective volume holographic optical element recorded in a holographic film.

3. A bar code scanner having a low cost, efficient vertical cavity surface emitting laser package, comprising:
    A) a head assembly;
    B) a vertical cavity surface emitting laser die bonded to a top surface of the head assembly, responsive to an electrical input current, generating a beam of light;
    C) a partially reflective volume holographic optical element recorded in a holographic film;
    D) a photodiode, die bonded to the top surface of the head assembly proximate to the vertical cavity surface emitting laser, arranged to receive at least a portion of the beam of light, for generating feedback for adjusting an electrical input current to the vertical cavity surface emitting laser based on a received optical power of the portion of the light received, wherein the vertical cavity surface emitting laser and the photodiode are injection molded in a predetermined shape, and wherein a recessed area for placement of the partially reflective volume holographic optical element recorded in a holographic film is provided in the injection molding providing for a predetermined alignment of the vertical cavity surface emitting laser and the photodiode with the partially reflective volume holographic optical element recorded in a holographic film.

4. An optical communication link that includes a low cost, efficient vertical cavity surface emitting laser package, comprising:
    A) a head assembly;
    B) a vertical cavity surface emitting laser die bonded to a top surface of the head assembly, responsive to an electrical input current, generating a beam of light;
    C) a partially reflective volume holographic optical element recorded in a holographic film;
    D) a photodiode, die bonded to the top surface of the head assembly proximate to the vertical cavity surface emitting laser, arranged to receive at least a portion of the beam of light, for generating feedback for adjusting an electrical input current to the vertical cavity surface emitting laser based on a received optical power of the portion of the light received, wherein the vertical cavity surface emitting laser and the photodiode are injection molded in a predetermined shape, and wherein a recessed area for placement of the partially reflective volume holographic optical element recorded in a holographic film is provided in the injection molding providing for a predetermined alignment of the vertical cavity surface emitting laser and the photodiode with the partially reflective volume holographic optical element recorded in a holographic film.

5. An optical storage unit that includes a low cost, efficient vertical cavity surface emitting laser package, comprising:
    A) a head assembly;
    B) a vertical cavity surface emitting laser die bonded to a top surface of the head assembly, responsive to an electrical input current, generating a beam of light;

C) a partially reflective volume holographic optical element recorded in a holographic film;

D) a photodiode, die bonded to the top surface of the head assembly proximate to the vertical cavity surface emitting laser, arranged to receive at least a portion of the beam of light, for generating feedback for adjusting an electrical input current to the vertical cavity surface emitting laser based on a received optical power of the portion of the light received, wherein the vertical cavity surface emitting laser and the photodiode are injection molded in a predetermined shape, and wherein a recessed area for placement of the partially reflective volume holographic optical element recorded in a holographic film is provided in the injection molding providing for a predetermined alignment of the vertical cavity surface emitting laser and the photodiode with the partially reflective volume holographic optical element recorded in a holographic film.

6. The optical storage unit of claim 5 wherein the optical storage unit is one of:

A) a compact disk player;

B) a digital video disk player;

C) a compact disk read-only memory drive;

D) a magneto-optical disk drive; and

E) a laser disk player.

* * * * *